US012604502B2

(12) United States Patent
Zhu et al.

(10) Patent No.: US 12,604,502 B2
(45) Date of Patent: Apr. 14, 2026

(54) NANOCHANNEL GALLIUM NITRIDE-BASED DEVICE AND MANUFACTURING METHOD THEREOF

(71) Applicant: Xidian University, Xi'an (CN)

(72) Inventors: Jiejie Zhu, Xi'an (CN); Xiaohua Ma, Xi'an (CN); Yue Hao, Xi'an (CN); Jingshu Guo, Xi'an (CN)

(73) Assignee: Xidian University, Xi'an (CN)

( * ) Notice: Subject to any disclaimer, the term of this patent is extended or adjusted under 35 U.S.C. 154(b) by 0 days.

(21) Appl. No.: 19/257,378

(22) Filed: Jul. 1, 2025

(65) Prior Publication Data

US 2025/0338573 A1      Oct. 30, 2025

Related U.S. Application Data

(63) Continuation of application No. PCT/CN2023/080475, filed on Mar. 9, 2023.

(51) Int. Cl.
H10D 62/10          (2025.01)
H10D 30/01          (2025.01)
(Continued)

(52) U.S. Cl.
CPC ......... H10D 62/118 (2025.01); H10D 30/015 (2025.01); H10D 30/476 (2025.01);
(Continued)

(58) Field of Classification Search
CPC .. H10D 62/118; H10D 30/015; H10D 30/476; H10D 62/102; H10D 62/126;
(Continued)

(56) References Cited

U.S. PATENT DOCUMENTS

2018/0138303 A1*  5/2018  Coffie ................... H10D 62/80
2021/0265477 A1*  8/2021  Lu ........................ H10D 30/475
2023/0411507 A1*  12/2023  Chen ..................... H10D 64/01

FOREIGN PATENT DOCUMENTS

CN        107958928 A      4/2018
CN        114361030 A   *  4/2022   ......... H10D 30/4755

OTHER PUBLICATIONS

Clams of PCT/CN2023/080475, Mar. 9, 2023.
ISA (CNIPA), Written opinion for PCT/CN2023/080475, Jun. 23, 2023.

* cited by examiner

*Primary Examiner* — Shahed Ahmed
(74) *Attorney, Agent, or Firm* — Hemisphere Law, PLLC

(57)          ABSTRACT

A nanochannel GaN-based device includes: a substrate layer, a nucleation layer, a buffer layer, a channel region, an insertion layer, a barrier layer, a cap layer, a first highly $n^+$-doped material layer, a second $n^+$-doped material layer, a source electrode, a drain electrode, and a gate electrode. A first arrayed pattern edge is formed on a side of the first $n^+$-doped material layer facing towards the drain electrode. A second arrayed pattern edge is formed on a side of the second $n^+$-doped material layer facing towards the source electrode. A part of the channel region, the insertion layer, the barrier layer and the cap layer form an arrayed nano-channel structure between a source electrode and a drain electrode. The first arrayed pattern edge is interdigitated with an end of the arrayed nanochannel structure. The second arrayed pattern edge is interdigitated with another end of the arrayed nanochannel structure.

7 Claims, 9 Drawing Sheets

(51) Int. Cl.
_H10D 30/47_ (2025.01)
_H10D 62/824_ (2025.01)
_H10D 64/27_ (2025.01)

(52) U.S. Cl.
CPC ......... _H10D 62/102_ (2025.01); _H10D 62/126_
(2025.01); _H10D 62/824_ (2025.01); _H10D_
_64/411_ (2025.01)

(58) Field of Classification Search
CPC ............... H10D 62/824; H10D 64/411; H10D
30/47–485; H10D 30/501–509; H10D
62/119–123; H10D 30/014
See application file for complete search history.

n⁺-doped material layer $n^+$-doped
material
layer

70

7

6

5

4

3

2

1

8

9

70

7

6

5

4

3

2

1

NANOCHANNEL GALLIUM NITRIDE-BASED DEVICE AND MANUFACTURING METHOD THEREOF

CROSS-REFERENCE TO RELATED APPLICATION

This application is a continuation of International Patent Application No. PCT/CN2023/080475, filed Mar. 9, 2023, which is herein incorporated by reference in its entirety.

TECHNICAL FIELD

The disclosure relates to the field of microelectronic technologies, and more particularly to a nanochannel gallium nitride (GaN)-based device and a manufacturing method thereof.

BACKGROUND

A GaN high electron mobility transistor (HEMT) can achieve high breakdown voltages, providing a high power density and peak efficiency, and exhibits great application potential in the fields of microwave, millimeter-wave, and terahertz amplifiers, and thus have received widespread attention. With the gradual maturation of GaN materials and device processes, in order to achieve higher spectral efficiency, higher data transmission rates, and higher energy efficiency, an operating frequency of a device continues to increase. A gate length is a direct factor affecting the operating frequency of the device. To obtain higher frequency characteristics, the gate length of the device continues to decrease, and during this process, the influence of short-channel effects becomes increasingly significant.

In addition, as the source-drain spacing of the device is proportionally reduced, an on-state resistance of the device gradually decreases, and a proportion of a contact resistance becomes increasingly significant. The high contact resistance not only affects the output current and power of the device but also limits the improvement of the operating frequency and efficiency of the device. Regrown ohmic contact has received widespread attention due to its ability to achieve extremely low contact resistance and high-quality patterns.

Studies have shown that the regrown ohmic contact has received widespread attention due to its ability to achieve an extremely low contact resistance and high-quality patterns. Current ohmic regrowth technologies mainly include etching recesses extending to a channel region in source and drain electrode regions, and then growing highly doped n-type gallium nitride ($n^+$-GaN) or highly doped n-type indium gallium nitride ($n^+$-InGaN) materials in the recesses to achieve ohmic contact between the source and drain electrodes and the heterojunction channel. In addition to the sheet resistance of the $n^+$-GaN or $n^+$-InGaN materials, reducing the contact resistance between the $n^+$-GaN or $n^+$-InGaN materials and the heterojunction channel is key to achieving low-resistance ohmic contact. However, the ohmic regions of current ohmic contact technologies are usually regular rectangles, and the contact area between the edge of the ohmic region in the secondary epitaxial region and the heterojunction channel is not large enough, which limits the further reduction of the contact resistance between the $n^+$-GaN or $n^+$-InGaN materials and the GaN heterojunction channel. In addition, the current nanochannel structure is defined after the ohmic contact is completed, which requires high precision in photolithography processes and a more complicated process.

Therefore, current GaN devices have drawbacks of relatively high ohmic contact resistance, significant short-channel effects, and high requirements for photolithography process precision.

SUMMARY

In order to solve the above problems in the related art, the disclosure provides a GaN-based device and its manufacturing method. Technical solutions used to solve the problems of the disclosure are as follows.

An embodiment of the disclosure provides a GaN-based device. The GaN-based device includes: a substrate layer, a nucleation layer, a buffer layer, a channel region, an insertion layer, a barrier layer, a cap layer, a first highly doped n-type ($n^+$-doped) material layer, a second $n^+$-doped material layer, a source electrode, a drain electrode and a gate electrode.

The substrate layer, the nucleation layer, the buffer layer, the channel region, the insertion layer, the barrier layer and the cap layer are sequentially stacked in that order.

The first $n^+$-doped material layer is disposed in a source electrode region, and penetrates through the cap layer, the barrier layer, and the insertion layer, a bottom of the first $n^+$-doped material layer is disposed under channels of the channel region, i.e., a bottom of the first $n^+$-doped material layer is disposed under an upper surface of the channel region, a first arrayed pattern edge is formed on a side of the first $n^+$-doped material layer facing towards the drain electrode, and the source electrode is disposed on the first $n^+$-doped material layer.

The second $n^+$-doped material layer is disposed in a drain electrode region and penetrates through the cap layer, the barrier layer, and the insertion layer, a bottom of the second $n^+$-doped material layer is disposed under the channels of the channel region, i.e., a bottom of the second $n^+$-doped material layer is disposed under an upper surface of the channel region, a second arrayed pattern edge is formed on a side of the second $n^+$-doped material layer facing towards the source electrode, and the drain electrode is disposed on the second $n^+$-doped material layer.

A part of the channel region, the insertion layer, the barrier layer and the cap layer together form an arrayed nanochannel structure between the source electrode region and the drain electrode region, the first arrayed pattern edge is interdigitated with an end of the arrayed nanochannel structure, and the second arrayed pattern edge is interdigitated with another end of the arrayed nanochannel structure.

The gate electrode is disposed between the first $n^+$-doped material layer and the second $n^+$-doped material layer, on the arrayed nanochannel structure and in recesses defined by the arrayed nanochannel structure, to form a three-dimensional gate-all-around structure.

In an embodiment, a material of the substrate layer includes one or more selected from the group consisting of sapphire, silicon carbide (SiC) and silicon (Si).

A material of the barrier layer includes one or more selected from the group consisting of aluminum nitride (AlN), indium aluminum nitride (InAlN), scandium aluminum nitride (ScAlN), and aluminum gallium nitride (AlGaN).

In an embodiment, a material of each of the first $n^+$-doped material layer and the second $n^+$-doped material layer includes at least one of $n^+$-GaN and $n^+$-InGaN.

In an embodiment, the first arrayed pattern edge includes multiple first rectangular structures, and the first rectangular structures are disposed evenly along an edge of the first $n^+$-doped material layer.

The second arrayed pattern edge includes multiple second rectangular structures, and the second rectangular structures are disposed evenly along an edge of the second $n^+$-doped material layer.

In an embodiment, a length of each first rectangular structure is in a range of 20-1500 nanometers (nm), a width of each first rectangular structure is in a range of 20-2000 nm, and a spacing between adjacent two of the first rectangular structures is in a range of 20-2000 nm.

A length of each second rectangular structure is in a range of 20-1500 nm, a width of each second rectangular structure is in a range of 20-2000 nm, and a spacing between adjacent two of the second rectangular structures is in a range of 20-2000 nm.

In an embodiment, the arrayed nanochannel structure includes at least one nanochannel, and when the at least one nanochannel is at least three in number, the nanochannels are disposed evenly along a gate width direction of the gate electrode.

In an embodiment, a width of each nanochannel is in a range of 20-2000 nm, and a spacing between adjacent two of the at least one nanochannel is in a range of 20-2000 nm.

An embodiment of the disclosure provides a manufacturing method of a nanochannel GaN-based device, including:

S1, sequentially growing a nucleation layer, a buffer layer, a channel region, an insertion layer, a barrier layer and a cap layer sequentially in that order on a substrate layer;

S2, growing a mask layer on the cap layer;

S3, defining patterns of an ohmic regrowth region and nanochannels on the mask layer, and etching a part of the cap layer, a part of the barrier layer, a part of the insertion layer, and a part of the channel region between the ohmic regrowth region and the nanochannels, to thereby form a first recess disposed in a source arrayed pattern region, a second recess disposed in a drain arrayed pattern region and an arrayed nanochannel structure disposed between the source arrayed pattern region and the drain arrayed pattern region, where the arrayed nanochannel structure retains a part of the mask layer;

S4, growing $n^+$-doped material layers in the first recess, the second recess and recesses defined by the arrayed nanochannel structure, and on the part of the mask layer;

S5, removing the $n^+$-doped material layers on the arrayed nanochannel structure between the source arrayed pattern region and the drain arrayed pattern region, and in the recesses defined by the arrayed nanochannel structure, and retaining the $n^+$-doped material layers in the source arrayed pattern region and the drain arrayed pattern region to form a first $n^+$-doped material layer and a second $n^+$-doped material layer, where a first arrayed pattern edge is formed on a side of the first $n^+$-doped material layer facing towards a drain electrode and is interdigitated with an end of the arrayed nanochannel structure, and a second arrayed pattern edge is formed on a side of the second $n^+$-doped material layer facing towards a source electrode and is interdigitated with another end of the arrayed nanochannel structure;

S6, removing the mask layer on the arrayed nanochannel structure and the cap layer;

S7, preparing the source electrode on the first $n^+$-doped material layer, and preparing the drain electrode on the second $n^+$-doped material layer; and S8, preparing a gate electrode on the arrayed nanochannel structure and in the recesses defined by the arrayed nanochannel structure, where the gate electrode is disposed between the first $n^+$-doped material layer and the second $n^+$-doped material layer, a top gate of the gate electrode is disposed on the arrayed nanochannel structure, and side gates of the gate electrode are disposed in the recesses defined by the arrayed nanochannel structure.

In an embodiment, a material of the mask layer includes silica ($SiO_2$), and a thickness of the mask layer is in a range of 40-400 nm.

In an embodiment, step S3 includes:

S31, spin-coating photoresist on the mask layer and performing exposure and development to form the patterns of the ohmic regrowth region and the nanochannels and expose the mask layer;

S32, removing an exposed part of the mask layer by using a fluorine-based dry etching process, and removing the part of the cap layer, the part of the barrier layer, the part of the insertion layer and the part of the channel region between the ohmic regrowth region and the nanochannels by using a chlorine (Cl)-based dry etching process to thereby form the first recess, the second recess and the arrayed nanochannel structure; and S33, removing the photoresist after etching.

Compared with the related art, embodiments of the disclosure may have the following benefit effect.

1. The nanochannel GaN-based device of the disclosure forms the first arrayed pattern edge on the side of the first $n^+$-doped material layer facing towards the drain electrode, and the second arrayed pattern edge on the side of the second $n^+$-doped material layer facing towards the source electrode. The source electrode is disposed on the first $n^+$-doped material layer, and the drain electrode is disposed on the second $n^+$-doped material layer. A nanochannel structure device is thereby formed based on patterned ohmic contact, effectively reducing the contact resistance of the device, forming better ohmic contact, further lowering the knee voltage of the device, and improving the working efficiency of the device.

2. The gate electrode of the nanochannel GaN-based device of the disclosure forms the three-dimensional gate-all-around structure. The two-dimensional electron gas in a channel is modulated from the side gates at two sides of the channel and from the top gate on the channel, thereby effectively suppressing the short-channel effect, enhancing the control ability of the gate electrode, improving the linearity of the device, and lowering the knee voltage of the device.

3. In the manufacturing method of the nanochannel GaN-based device of the disclosure, the mask layer is first grown, and then the patterns of the ohmic regrowth region and the nanochannels are defined simultaneously, which allows the nanochannel structure and patterned regrown ohmic contact structure to be formed in one step. The mask layer is used simultaneously as a mask for ohmic regrowth and the nanochannels, achieving self-alignment of the nanochannels, thereby effectively avoiding process errors and simplifying the process.

DETAILED DESCRIPTION OF EMBODIMENTS

The disclosure will be further described in detail with specific embodiments below, but embodiments of the disclosure are not limited to these.

Embodiment 1

Figure 1:
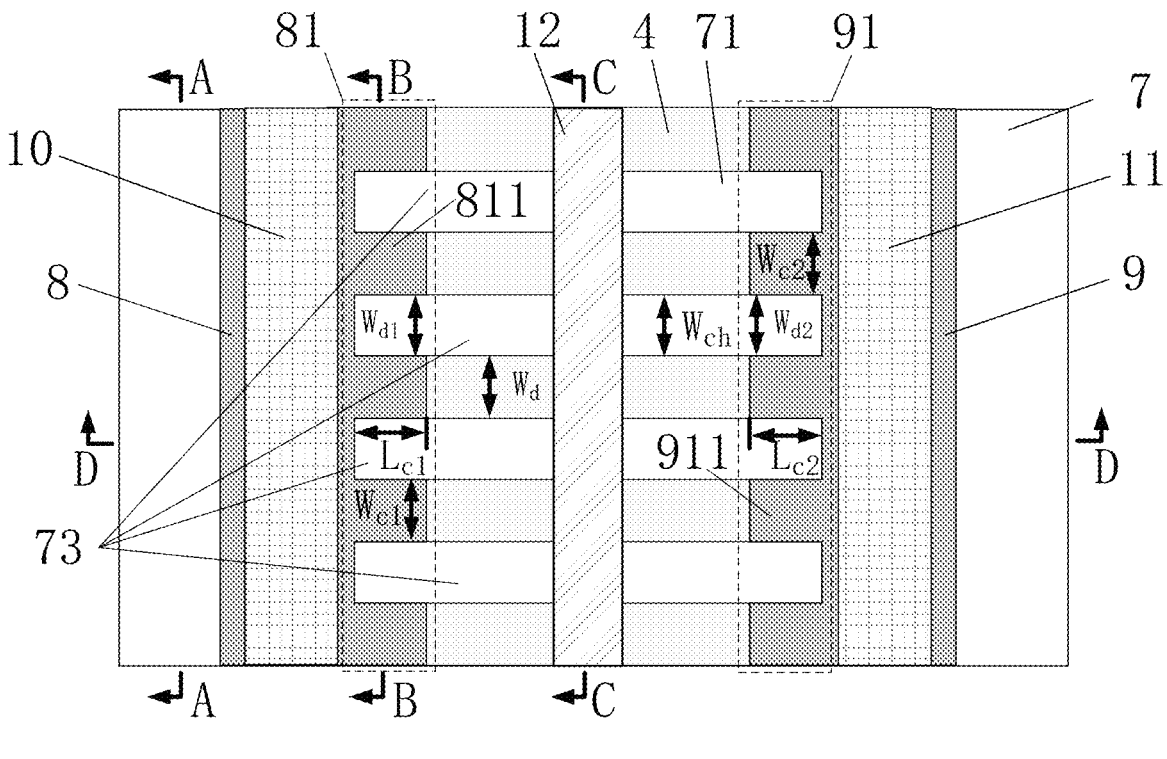
FIG. 1 illustrates a top view of an overall structure of a nanochannel GaN-based device according to an embodiment of the disclosure.
Figure 2:
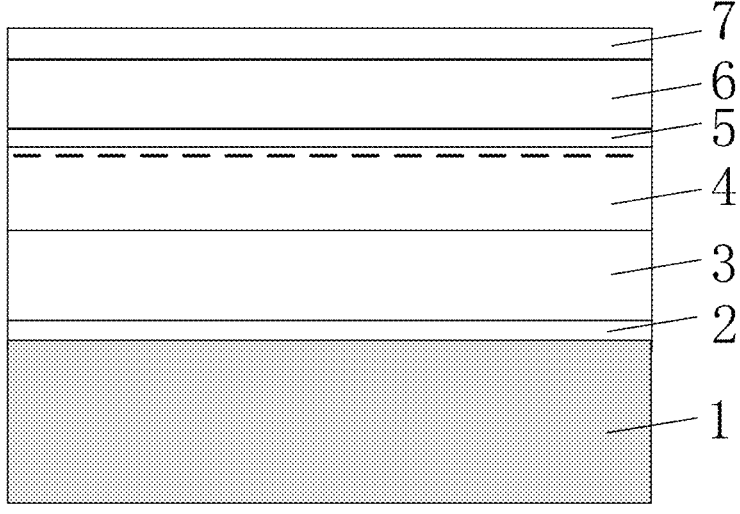
FIG. 2 illustrates a cross-sectional view of an A-A plane illustrated in FIG. 1.
Figure 3:
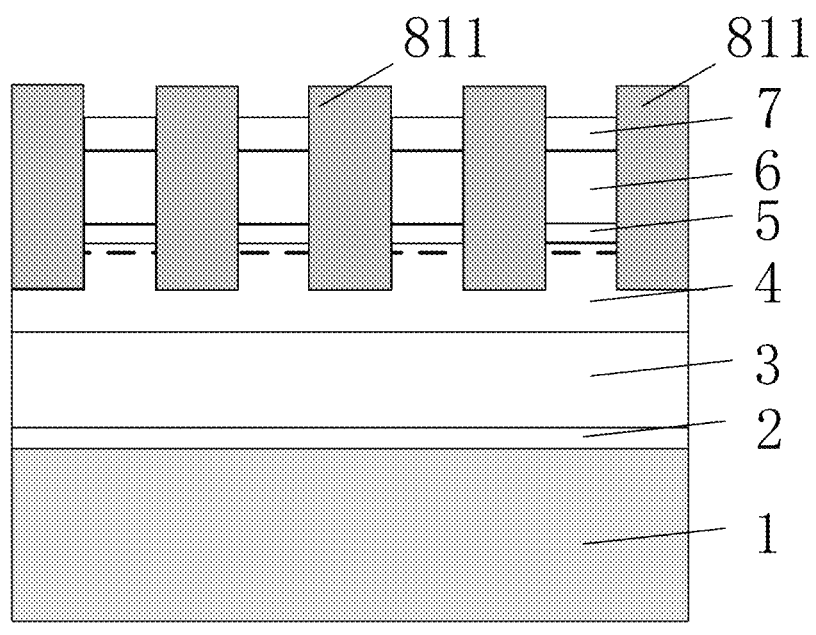
FIG. 3 illustrates a cross-sectional view of a B-B plane illustrated in FIG. 1.
Figure 4:
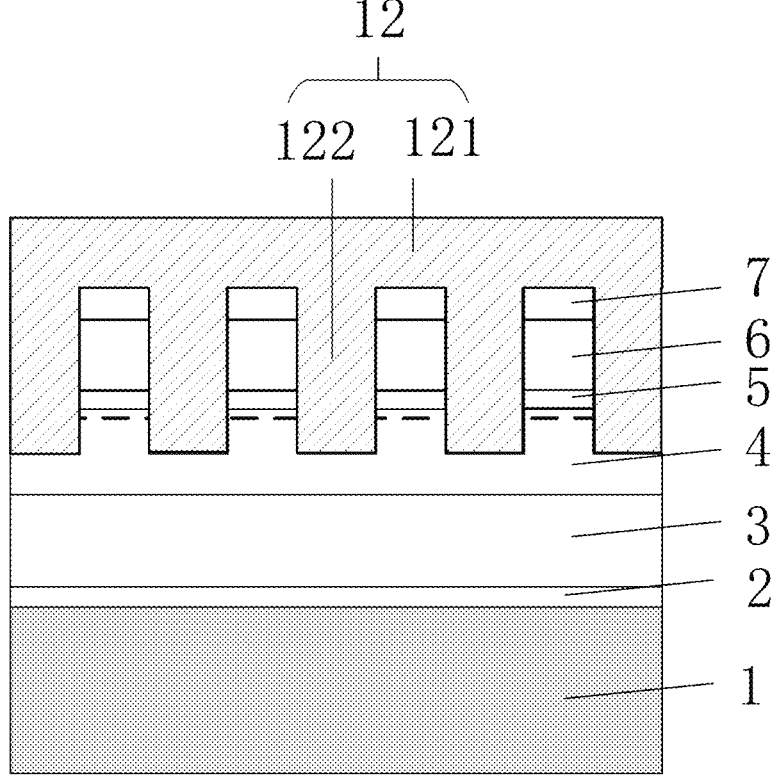
FIG. 4 illustrates a cross-sectional view of a C-C plane illustrated in FIG. 1.
Figure 5:
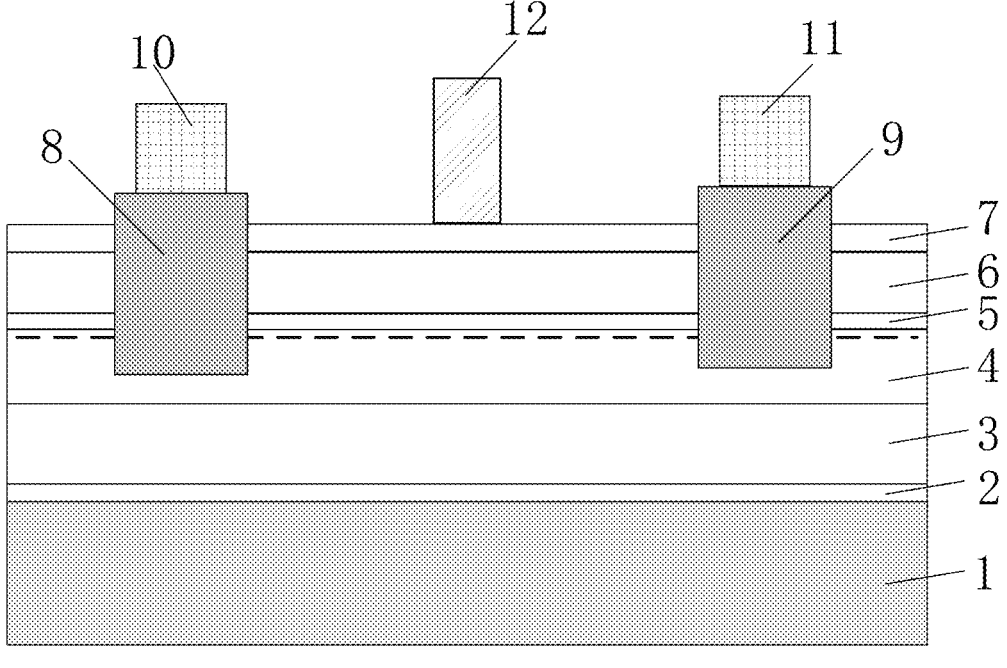
FIG. 5 illustrates a cross-sectional view of a D-D plane illustrated in FIG. 1.

Referring to FIGS. 1-5, FIG. 1 illustrates a top view of an overall structure of a nanochannel GaN-based device according to an embodiment of the disclosure, FIG. 2 illustrates a cross-sectional view of an A-A plane illustrated in FIG. 1, FIG. 3 illustrates a cross-sectional view of a B-B plane illustrated in FIG. 1, FIG. 4 illustrates a cross-sectional view of a C-C plane illustrated in FIG. 1, and FIG. 5 illustrates a cross-sectional view of a D-D plane illustrated in FIG. 1.

The nanochannel GaN-based device in the embodiment includes: a substrate layer 1, a nucleation layer 2, a buffer layer 3, a channel region 4, an insertion layer 5, a barrier layer 6, a cap layer 7, a first $n^+$-doped material layer 8, a second $n^+$-doped material layer 9, a source electrode 10, a drain electrode 11 and a gate electrode 12.

The substrate layer 1, the nucleation layer 2, the buffer layer 3, the channel region 4, the insertion layer 5, the barrier layer 6 and the cap layer 7 are sequentially stacked in that order.

The first $n^+$-doped material layer 8 is disposed in a source electrode region, and penetrates through the cap layer 7, the barrier layer 6, and the insertion layer 5, a bottom of the first $n^+$-doped material layer 8 is disposed under channels of the channel region 4, a first arrayed pattern edge 81 is formed on a side of the first $n^+$-doped material layer 8 facing towards the drain electrode 11, and the source electrode 10 is disposed on the first $n^+$-doped material layer 8. The source electrode 10 forms an ohmic metal electrode on the first $n^+$-doped material layer 8.

Specifically, a first recess 80 is formed in the source electrode region by etching a part of the cap layer 7, a part of the barrier layer 6, a part of the insertion layer 5 and a part of the channel region 4 in the source electrode region. A depth of the first recess 80 extends to below the channels of the channel region 4. The first arrayed pattern edge 81 is disposed on a side of the first recess 80 facing towards the drain electrode 11, and the first $n^+$-doped material layer 8 is filled in the first recess 80.

The second $n^+$-doped material layer 9 is disposed in a drain electrode region and penetrates through the cap layer 7, the barrier layer 6, and the insertion layer 5, a bottom of the second $n^+$-doped material layer 9 is disposed under the channels of the channel region 4, a second arrayed pattern edge 91 is formed on a side of the second $n^+$-doped material layer 9 facing towards the source electrode 10, and the drain electrode 11 is disposed on the second $n^+$-doped material layer 9.

Specifically, a second recess 90 is formed in the drain electrode region by etching a part of the cap layer 7, a part of the barrier layer 6, a part of the insertion layer 5 and a part of the channel region 4 in the drain electrode region. A depth of the second recess 90 extends to below the channels of the channel region 4. The second arrayed pattern edge 91 is disposed on the side of the second recess 90 facing towards the source electrode 10, and the second $n^+$-doped material layer 9 is filled in the second recess 90. The drain electrode 11 forms an ohmic metal electrode on the second $n^+$-doped material layer 9.

The nanochannel GaN-based device of the embodiment includes: the first arrayed pattern edge 81 formed on the side of the first $n^+$-doped material layer 8 facing towards the drain electrode 11, the second arrayed pattern edge 91 formed on the side of the second $n^+$-doped material layer 9 facing towards the source electrode 10, the source electrode 10 disposed on the first $n^+$-doped material layer 8, and the drain electrode 11 disposed on the second $n^+$-doped material layer 9, to thereby form a nanochannel structure device based on patterned ohmic contact, effectively reducing the contact resistance of the device, forming better ohmic contact, further lowering the knee voltage of the device, and improving the working efficiency of the device.

A part of the channel region 4, the insertion layer 5, the barrier layer 6 and the cap layer 7 together form an arrayed nanochannel structure 71 between the source electrode region and the drain electrode region. The first arrayed pattern edge 81 is interdigitated with an end of the arrayed nanochannel structure 71, and the second arrayed pattern edge 91 is interdigitated with another end of the arrayed nanochannel structure 71.

Specifically, arrayed recesses are formed by etching a part of the cap layer 7, a part of the barrier layer 6, a part of the insertion layer 5 and a part of the channel region 4 between the source electrode region and the drain electrode region. A depth of each arrayed recess extends to below the channels of the channel region 4. Meanwhile, retained parts of the cap layer 7, the barrier layer 6, the insertion layer 5 and the channel region 4 between the arrayed recesses form the arrayed nanochannel structure 71. In an embodiment, the first arrayed pattern edge 81 is disposed on an end of the arrayed recesses and matches with the end of the arrayed nanochannel structure 71, and the second arrayed pattern edge 91 is disposed on another end of the arrayed recesses and matches with the another end of the arrayed nanochannel structure 71.

The gate electrode 12 is disposed between the first $n^+$-doped material layer 8 and the second $n^+$-doped material layer 9, on the arrayed nanochannel structure 71 and in recesses 72 (i.e., the arrayed recesses) defined by the arrayed nanochannel structure 71, to form a three-dimensional gate-all-around structure.

Specifically, the gate electrode 12 includes a top gate 121 and side gates 122, the top gate 121 is disposed on the side gates 122 and on the arrayed nanochannel structure 71, and the side gates 122 are disposed in the recesses 72 defined by the arrayed nanochannel structure 71. Two sidewalls of the side gates 122 and the top gate 121 may simultaneously modulate the two-dimensional electron gas in the channels, thereby forming a three-dimensional gate-all-around structure.

The gate electrode of the nanochannel GaN-based device of the embodiment forms the three-dimensional gate-all-around structure. The two-dimensional electron gas in a channel is modulated from the side gates at two sides of the channel and from the top gate on the channel, thereby effectively suppressing the short-channel effect, enhancing the control ability of the gate electrode, improving the linearity of the device, and lowering the knee voltage of the device.

In a specific embodiment, a material of the substrate layer 1 includes one or more selected from the group consisting of sapphire, SiC and Si. A material of the barrier layer 6 includes one or more selected from the group consisting of AlN, InAlN, ScAlN, and AlGaN. A material of each of the first $n^+$-doped material layer 8 and the second $n^+$-doped material layer 9 includes at least one of $n^+$-GaN and $n^+$-In-GaN.

In a specific embodiment, the first arrayed pattern edge 81 includes multiple first rectangular structures 811, and the first rectangular structures 811 are disposed evenly along an edge of the first $n^+$-doped material layer 8.

Specifically, the first rectangular structures 811 disposed evenly are formed on the edge of the first $n^+$-doped material layer 8 facing towards the drain electrode 11. Optionally, a length $L_{c1}$ of each first rectangular structure 811 is in a range of 20-1500 nm, a width $W_{c1}$ of each first rectangular structure 811 is in a range of 20-2000 nm, and a spacing $W_{d1}$ between adjacent two of the first rectangular structures 811 is in a range of 20-2000 nm.

In a specific embodiment, the second arrayed pattern edge 91 includes multiple second rectangular structures 911, and the second rectangular structures 911 are disposed evenly along an edge of the second $n^+$-doped material layer 9.

Specifically, the second rectangular structures 911 disposed evenly are formed on the edge of the second $n^+$-doped material layer 9 near the source electrode 10. Optionally, A length $L_{c2}$ of each second rectangular structure 911 is in a range of 20-1500 nm, a width $W_{c2}$ of each second rectangular structure 911 is in a range of 20-2000 nm, and a spacing $W_{d2}$ between adjacent two of the second rectangular structures 911 is in a range of 20-2000 nm.

In a specific embodiment, the first arrayed pattern edge 81 and the second arrayed pattern edge 91 have a same structure, i.e., the first arrayed pattern edge 81 and the second arrayed pattern edge 91 have the same number of rectangular structures, and lengths, widths and spacings of the rectangular structures of the first arrayed pattern edge 81 and lengths, widths and spacings of the rectangular structures of the second arrayed pattern edge 91 are the same.

It should be noted that, the structures of the first arrayed pattern edge 81 and the second arrayed pattern edge 91 are not limited to the aforementioned rectangular structures, and may be smooth arc-shaped edge structures, serrated edge structures and trapezoidal edge structures, etc., without further restrictions in the embodiment.

In a specific embodiment, the arrayed nanochannel structure 71 includes at least one nanochannel 73, and when the at least one nanochannel 73 is at least three in number, the nanochannels 73 are disposed evenly along a gate width direction of the gate electrode 12.

It can be understood that, a number of the nanochannels 73 of the arrayed nanochannel structure 71 is n, and n is greater than or equal to 1. When there are multiple nanochannels 73, the spacing between adjacent two nanochannels 73 is same and uniform.

Specifically, a width $W_{ch}$ of each nanochannel 73 is in a range of 20-2000 nm, and a spacing $W_d$ between adjacent two nanochannels 73 is in a range of 20-2000 nm.

In summary, the nanochannel GaN-based device of the embodiment can significantly reduce the knee voltage of the device, suppress the short-channel effect, thus improving the work efficiency and linearity, thereby realizing a higher performance millimeter wave power device.

Embodiment 2

On a basis of the embodiment 1, this embodiment provides a manufacturing method of the nanochannel GaN-based device.

Referring to FIGS. 6A-6L, FIGS. 6A-6L illustrate schematic process diagrams of the manufacturing method of the nanochannel GaN-based device according to the embodiment of the disclosure.

This embodiment illustrates the manufacturing of a low-contact-resistance GaN-based device, which uses the sapphire as a substrate. Depths of the source and drain regrowth regions and the nanochannel recesses, i.e., the depths of the first recess 80, the second recess 90, and each of the arrayed recesses, are 45 nm. The recess patterns are shown in FIG. 7, which is a top view corresponding to FIG. 6C. The width $W_{ch}$ of each nanochannel 73 is 400 nm, and the length $L_{ch}$ of each nanochannel 73 is 1.5 micrometers (μm). The first $n^+$-doped material layer 8 and the second $n^+$-doped material layer 9 use highly doped $n^+$-GaN, which is prepared using molecular beam epitaxy (MBE) process.

Specifically, the manufacturing method of the nanochannel GaN-based device includes following steps S1-S10.

Figure 6A:
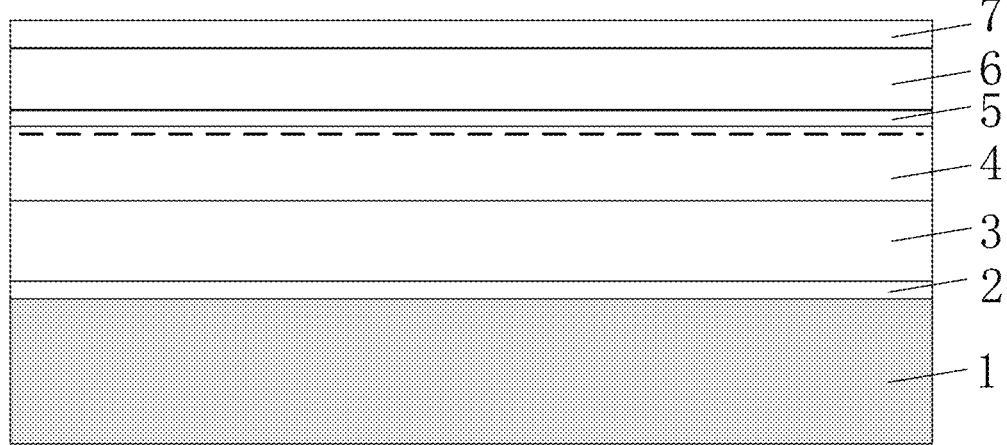
FIGS. 6A-6L illustrate schematic process diagrams of a manufacturing method of the nanochannel GaN-based device according to an embodiment of the disclosure.

S1, the nucleation layer 2, the buffer layer 3, the channel region 4, the insertion layer 5, the barrier layer 6 and the cap layer 7 are sequentially grown in that order on the substrate layer 1, as shown in FIG. 6A.

Specifically, on the sapphire substrate layer 1, the metal-organic chemical vapor deposition (MOCVD) process is used to sequentially grow the AlN nucleation layer 2, the GaN buffer layer 3, the GaN channel region 4, the AlN insertion layer 5, the InAlN barrier layer 6 and the GaN cap layer 7 in that order.

Figure 6B:
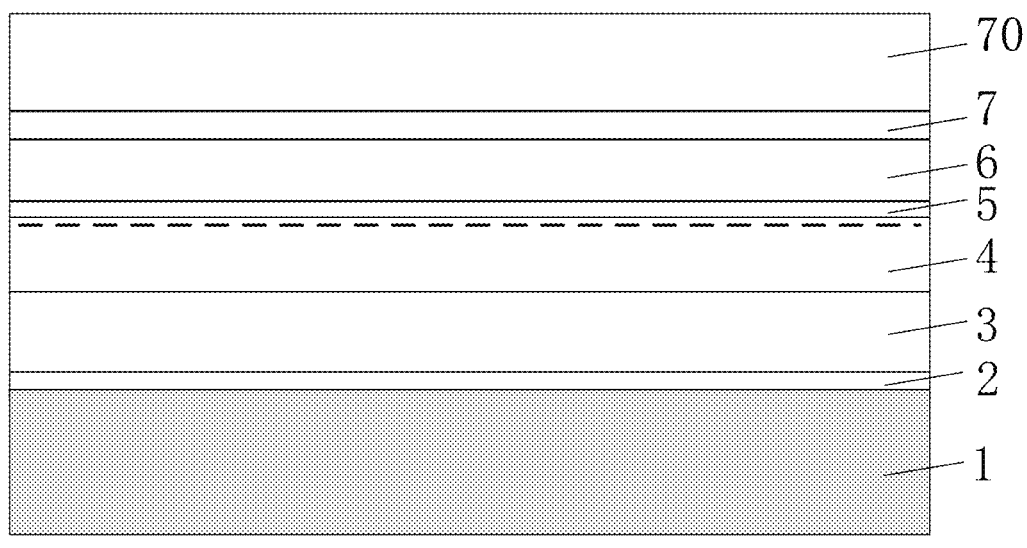

S2, a mask layer 70 is grown on the cap layer 7, as shown in FIG. 6B.

Specifically, the plasma enhanced chemical vapor deposition (PECVD) process is used to depositing the $SiO_2$ mask layer 70 on the cap layer 7. Specifically, silane ($SiH_4$) and nitrous oxide ($N_2O$) are used as precursors to deposit $SiO_2$ at an oven temperature of 300° C. as a regrown mask layer 70. A thickness of the mask layer 70 is in a range of 40-400 nm.

Figure 6C:
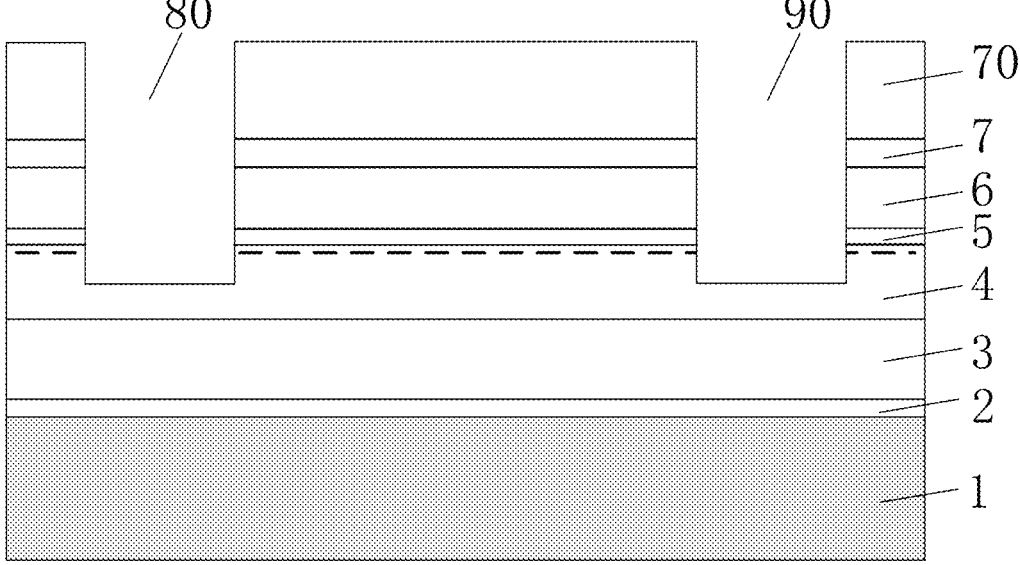
Figure 6D:
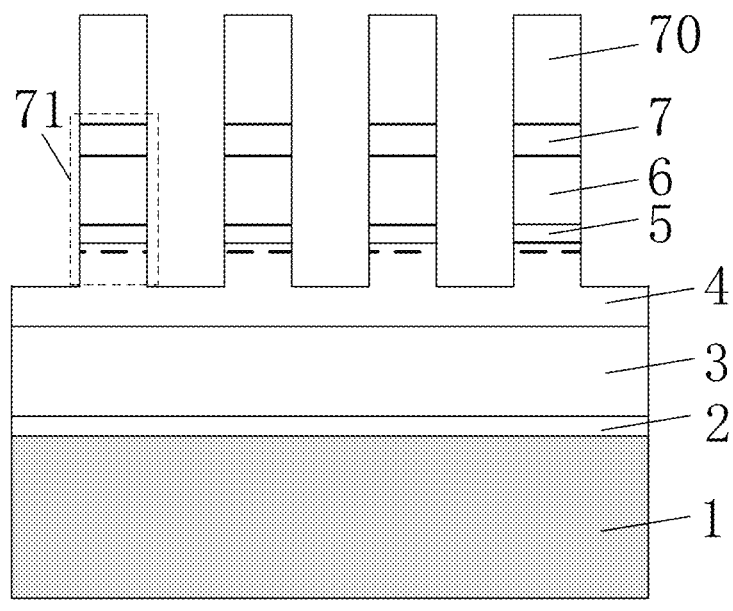
Figure 7:
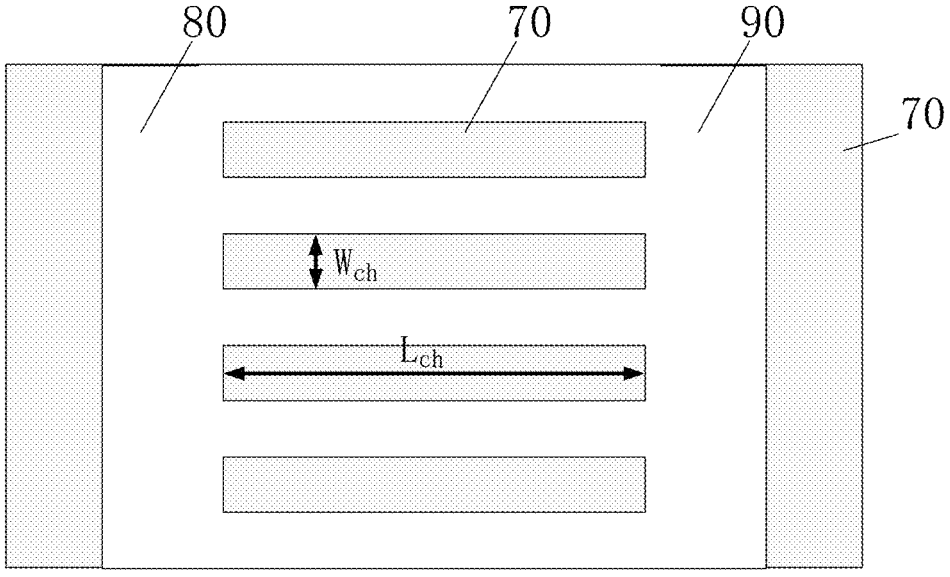
FIG. 7 illustrates a top view corresponding to FIG. 6C.

S3, patterns of an ohmic regrowth region and nanochannels 73 are defined on the mask layer 70; and a part of the cap layer 7, a part of the barrier layer 6, a part of the insertion layer 5 and a part of the channel region 4 between the ohmic regrowth region and the nanochannels 73 are etched, to thereby form the first recess 80 disposed in a source arrayed pattern region, the second recess 90 disposed in a drain arrayed pattern region and the arrayed nanochannel structure 71 disposed between the source arrayed pattern region and the drain arrayed pattern region; where the arrayed nanochannel structure 71 retains a part of the mask layer 70; as shown in FIGS. 6C-6D. Step S3 includes following steps S31-S33.

S31, photoresist is spin-coated on the mask layer 70, and exposure and development are performed to form the patterns of the ohmic regrowth region and the nanochannels 73 and expose the mask layer 70.

Specifically, the photoresist is coated on the $SiO_2$ mask layer 70, with a thickness of the photoresist about 1.2 μm, followed by pre-baking for 1 minute. Then, the exposure is performed on the pattern regions of the ohmic regrowth region and the nanochannels 73, followed by post-baking for 1 minute. After the post-baking is completed and a sample temperature has dropped to room temperature, the development is performed to remove the photoresist in the patterned region, thereby completing the photolithography, thus forming the patterns of the ohmic regrowth region and the nanochannels 73 while exposing a part of the mask layer 70 in these regions, as shown in FIG. 7.

S32, an exposed part of the mask layer 70 is removed by using an F-based dry etching process, and the part of the cap layer 7, the part of the barrier layer 6, the part of the insertion layer 5 and the part of the channel region 4 between the ohmic regrowth region and the nanochannels 73 are removed by using a Cl-based dry etching process, to thereby form the first recess 80, the second recess 90 and the arrayed nanochannel structure 71.

Specifically, before etching, the sample obtained in step S31 is baked on a hot plate at 100° C. for 1 minute to enhance the etch resistance of the photoresist. Then, an inductively coupled plasma (ICP) etching process is used to perform the F-based dry etching process to remove the exposed part of the $SiO_2$ mask layer 70 after photolithography. Subsequently, the Cl-based ICP etching is used to remove the part of the GaN cap layer 7, the part of the InAlN barrier layer 6, the part of the AlN insertion layer 5 and the part of the GaN channel layer 4 under the $SiO_2$ mask layer 70. The etch is performed to below the channels of the GaN channel layer 4, with an etching depth of 45 nm, forming the first recess 80, the second recess 90, and the arrayed nanochannel structure 71, as shown in FIGS. 6C-6D. FIG. 6C corresponds to the D-D plane illustrated in FIG. 1, and FIG. 6D corresponds to the C-C plane illustrated in FIG. 1. S33, the photoresist is removed after etching.

Specifically, the sample obtained in step S32 is placed into acetone and isopropanol sequentially in that order for ultrasonic cleaning to remove the photoresist on the surface, followed by rinsing with ultrapure water and then drying.

Figure 6E:
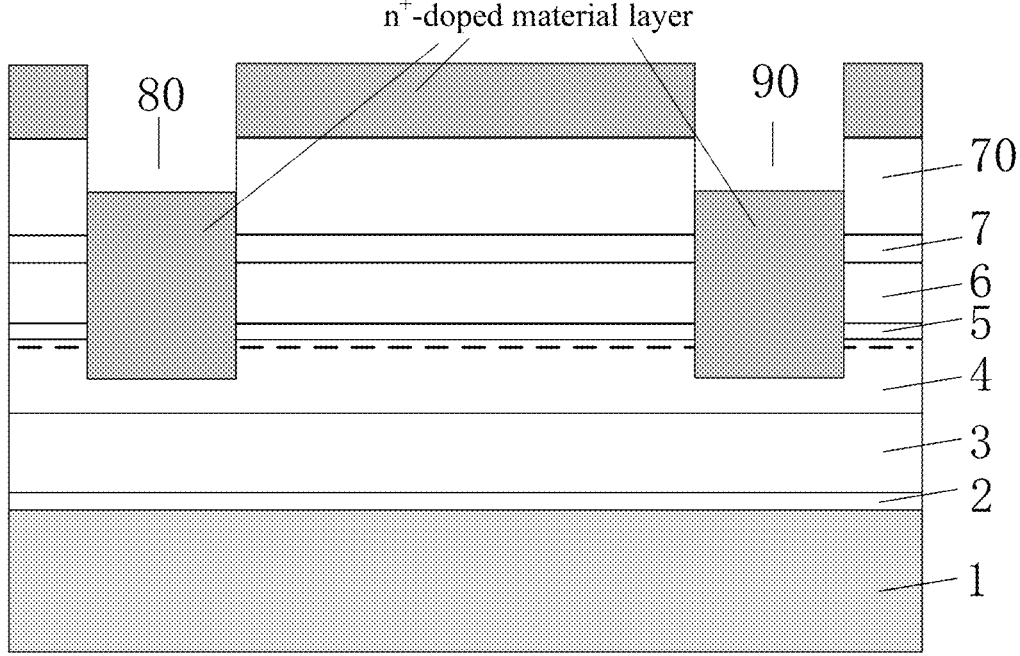
Figure 6F:
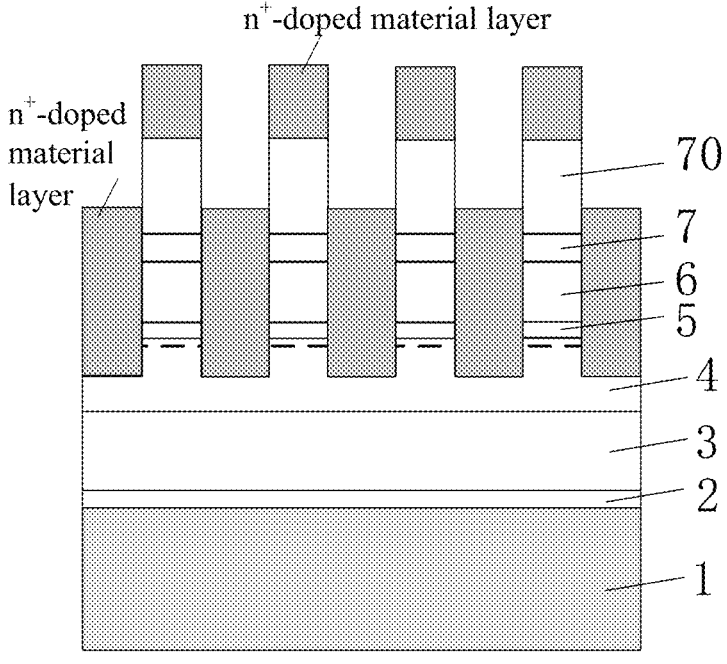

S4, n⁺-doped material layers are grown in the first recess 80, the second recess 90 and recesses 72 defined by the arrayed nanochannel structure 71, and on the retained part of the mask layer 70, as show in FIGS. 6E-6F. FIG. 6E corresponds to the D-D plane illustrated in FIG. 1, and FIG. 6F corresponds to the C-C plane illustrated in FIG. 1.

Specifically, the MBE process is used to grow the highly doped n⁺-GaN layers. The doping element includes Si. The doping concentration of the Si is $1 \times 10^{20}$ $cm^{-3}$. the growth thickness is 80 nm.

Figure 6G:
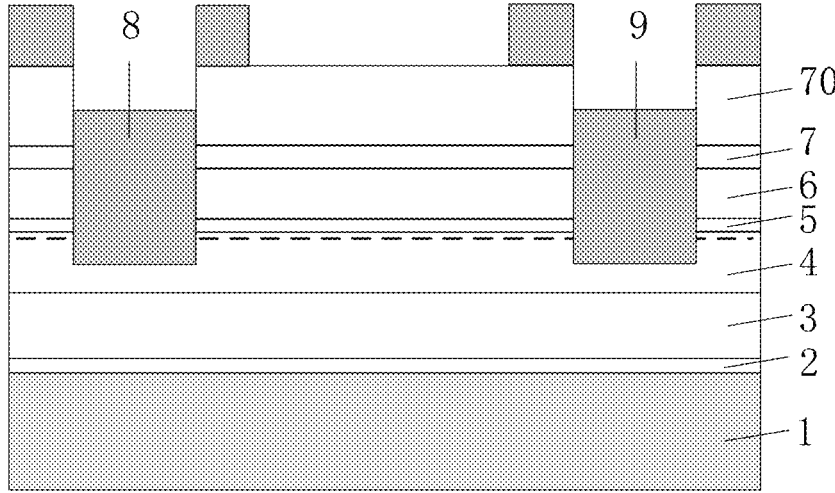
Figure 6H:
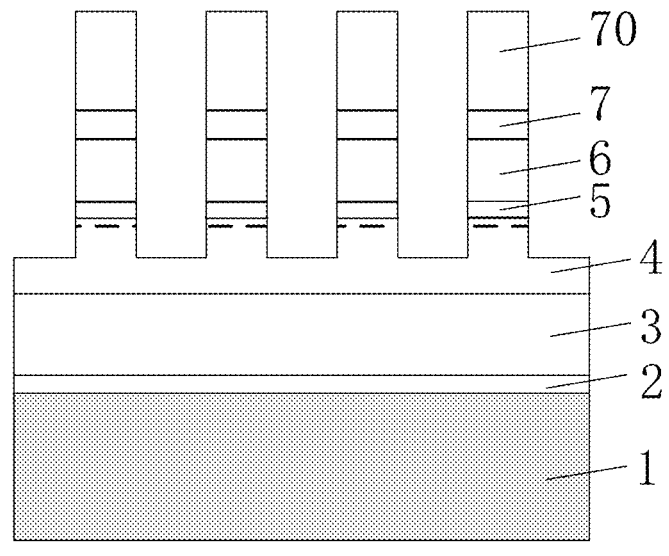

S5, the n⁺-doped material layers on the arrayed nanochannel structure 71 between the source arrayed pattern region and the drain arrayed pattern region, and in the recesses 72 defined by the arrayed nanochannel structure 71 are removed, and the n⁺-doped material layers in the source arrayed pattern region and the drain arrayed pattern region are retained to form the first n⁺-doped material layer 8 and the second n⁺-doped material layer 9, as shown in FIGS. 6G-6H. Step S5 specifically includes following steps S51-S53.

S51, a rectangular region between the source arrayed pattern region and the drain arrayed pattern region is defined through photolithography on the n⁺-doped material layers.

Specifically, the photoresist is coated on the n⁺-GaN material layers with a thickness of the photoresist about 0.7 μm, followed by pre-baking for 1 minute; then the exposure is performed on the rectangular region between the source arrayed pattern region and the drain arrayed pattern region, followed by post-baking for 1 minute; after the baking is completed and the sample temperature has dropped to room temperature, the development is performed to remove the photoresist in the rectangular region between the source arrayed pattern region and the drain arrayed pattern region, completing the photolithography.

S52, the n⁺-doped material layers on the arrayed nanochannel structure 71 between the source arrayed pattern region and the drain arrayed pattern region, and in the recesses 72 defined by the arrayed nanochannel structure 71 are etched, and the n⁺-doped material layers in the source arrayed pattern region and the drain arrayed pattern region are retained to form the first n⁺-doped material layer 8 and the second n⁺-doped material layer 9.

Specifically, the photoresist and the $SiO_2$ mask layer 70 are used as an etch mask for dry etching, the n⁺-GaN material layers on the rectangular region between the source arrayed pattern region and the drain arrayed pattern region are removed through the Cl-based ICP etching, i.e., the n⁺-doped material layers on the arrayed nanochannel structure 71 and in the recesses 72 defined by the arrayed nanochannel structure 71 are etched and removed, with an etching depth of 100 nm. The retained part of n⁺-GaN material layers form the first n⁺-doped material layer 8 and the second n⁺-doped material layer 9, as shown in FIGS. 6G-6H. FIG. 6G corresponds to the D-D plane illustrated in FIG. 1, and FIG. 6H corresponds to the C-C plane illustrated in FIG. 1.

S53, the photoresist is removed after etching.

Specifically, the sample obtained in step S52 is placed into acetone and isopropanol sequentially in that order for ultrasonic cleaning to remove the photoresist on the surface, followed by rinsing with ultrapure water and then drying.

Figure 6I:
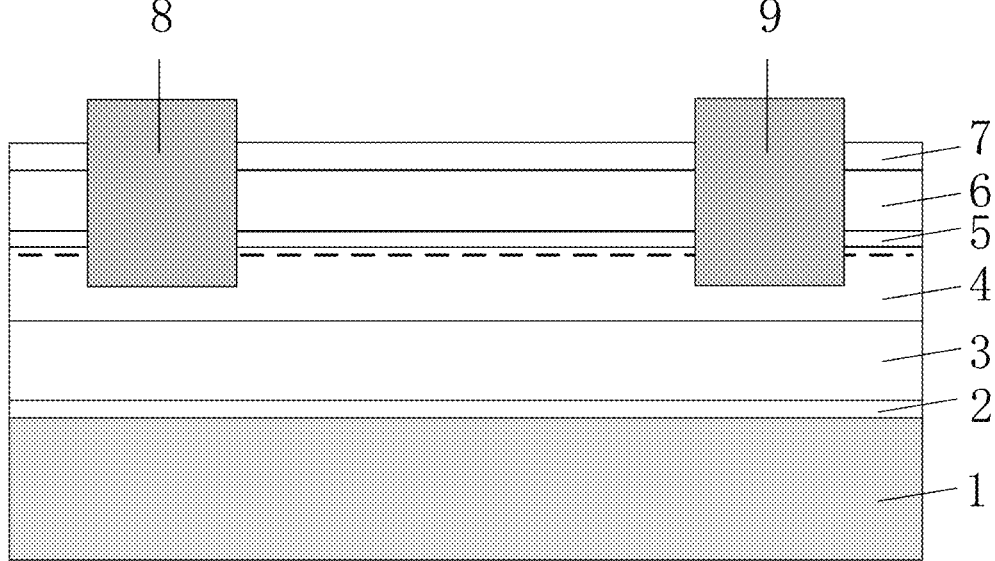
Figure 6J:
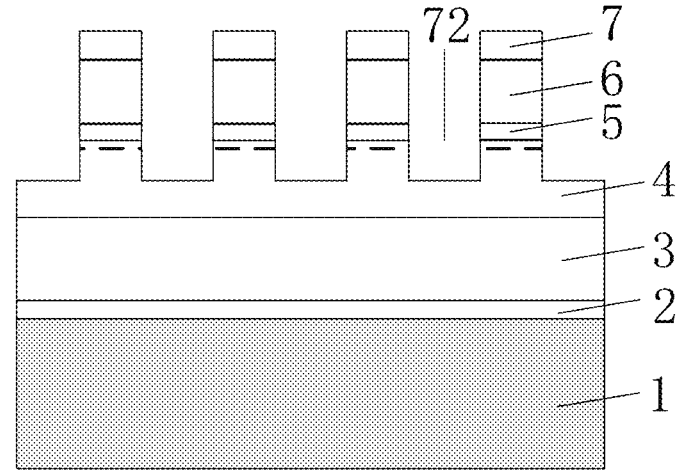

S6, the mask layer 70 on the arrayed nanochannel structure 71 and the cap layer 7 is removed, as shown in FIGS. 6I-6J. FIG. 6I corresponds to the D-D plane illustrated in FIG. 1, and FIG. 6J corresponds to the C-C plane illustrated in FIG. 1.

Specifically, the sample obtained in step S5 is soaked in a hydrogen fluoride (HF) solution ($HF:H_2O=2:3$) for 15 minutes to completely etch the $SiO_2$ mask layer 70 on the device surface and then rinsed with ultrapure water for 2 minutes followed by drying with nitrogen gas to obtain a dried sample; subsequently, the dried sample is placed sequentially into acetone, stripping solution, acetone, and isopropanol in that order for ultrasonic cleaning, and then rinsed with ultrapure water followed by drying.

Figure 6K:
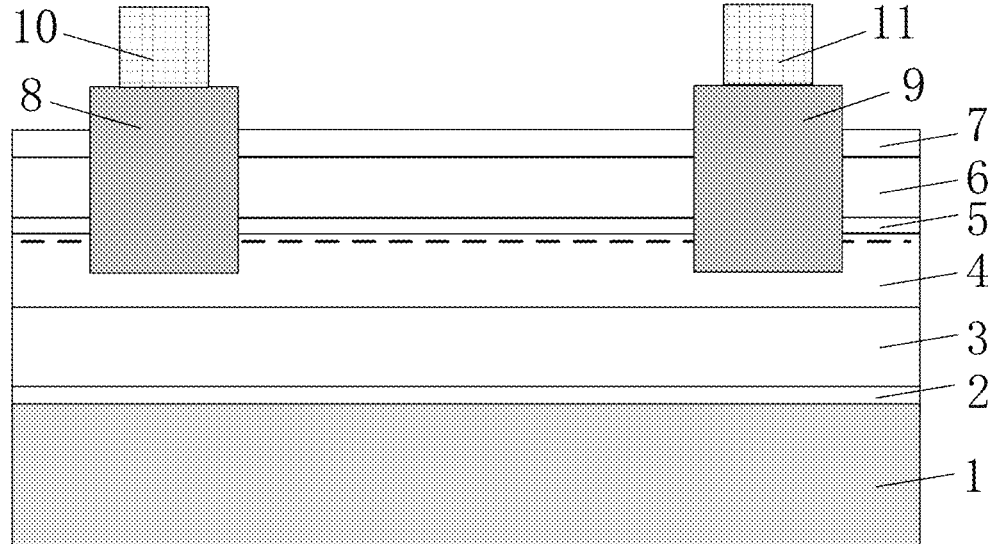

S7, the source electrode 10 is prepared on the first n⁺-doped material layer 8, and the drain electrode 11 is prepared on the second n⁺-doped material layer 9, as shown in FIG. 6K. Step S7 specifically includes following steps S71-S73.

S71, a source electrode pattern is formed through photolithography on the first n⁺-doped material layer 8, and a drain electrode pattern is formed through photolithography on the second n⁺-doped material layer 9.

Specifically, a double-layer photoresist is coated on the sample obtained in step S6, with a thickness of lift-off resist at a bottom layer about 0.35 μm and a thickness of photoresist at a top layer about 0.56 μm; then, the exposure is performed on the metal electrode pattern region, followed by post-baking for 1 minute; after the post-baking is completed and a sample temperature has dropped the room temperature, the development is performed to remove the photoresist on the metal electrode pattern region, thereby completing the photolithography.

S72, titanium/aurum (Ti/Au) metal electrodes are deposited via an electron-beam evaporation device.

Specifically, the residual photoresist is removed from the exposed region by using a plasma resist remover, and then the electron-beam evaporation device is used to sequentially evaporate a Ti layer with a thickness of 20 nm and an Au layer with a thickness of 200 nm.

S73, the metal in the unexposed region is stripped to form the source electrode 10 and the drain electrode 11.

Specifically, the sample obtained after the metal evaporation is soaked in acetone for over 3 hours followed by ultrasonicating until the metal in the unexposed region completely peels off to obtain a first metal-removed sample. The first metal-removed sample is placed in a stripping solution at 60° C. for water-bath heating for 15 minutes, and then placed in acetone and isopropanol sequentially in that order for ultrasonic cleaning for 3 minutes, followed by rinsing with ultrapure water for 2 minutes and then drying with nitrogen gas to form the source electrode 10 and the drain electrode 11.

S8, mesa isolation is performed, including following steps S81-S83.

S81, mesa isolation patterns are formed through photolithography.

Specifically, the sample obtained in step S7 is coated with a single-layer anti-etching resist with a thickness of 0.7 μm to obtain a coated sample, the exposure is performed on the non-source region of the coated sample through a mask by using a photolithography machine followed by post-baking for 1 minute, and after the post-baking is completed and a sample temperature has dropped to the room temperature, the development is performed to remove the photoresist on the non-source region, completing the photolithography.

S82, dry etching is performed to remove a part of the cap layer 7, a part of the barrier layer 6, a part of the insertion layer 5, a part of the channel region 4 and a part of the buffer layer 3 on the non-source region, to form the mesa isolation.

Specifically, before etching, the sample obtained in step S81 is baked at 100° C. for 1 minute by using a hot plate to enhance the etch resistance of the photoresist. Then, the dry etching is performed using the ICP process to remove the part of the GaN cap layer 7, the part of InAlN barrier layer 6, the part of AlN insertion layer 5, the part of GaN channel region 4 and the part of the GaN buffer layer 3 on the non-source region, with an etching depth of 150 nm, forming the mesa isolation.

S83, the photoresist is removed after etching.

Specifically, the sample obtained in step S82 is placed into acetone, a stripping solution, acetone, and isopropanol sequentially in that order for ultrasonic cleaning to remove the photoresist on the surface, followed by rinsing with ultrapure water and then drying.

Figure 6L:
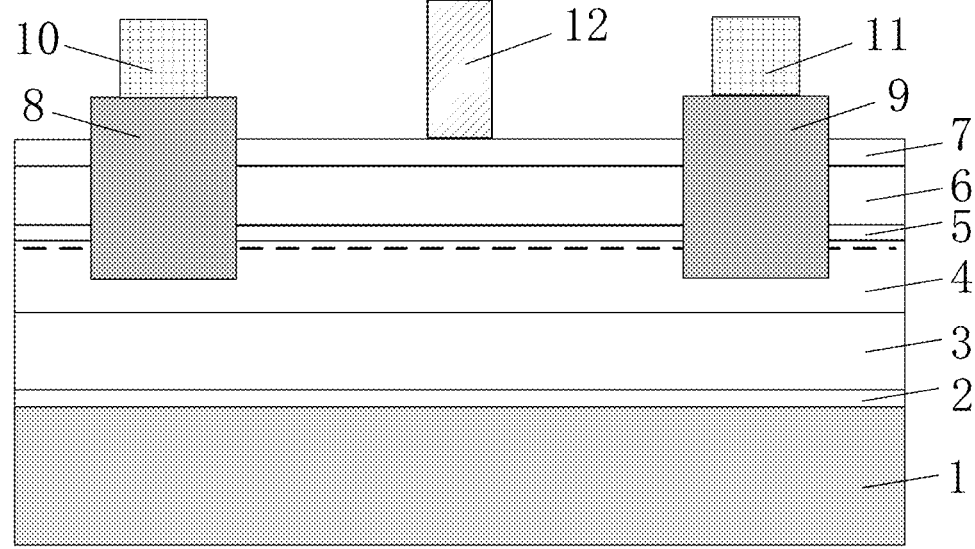

S9, the gate electrode 12 is prepared on the arrayed nanochannel structure 71 and in the recesses 72 defined by the arrayed nanochannel structure 71, making the gate electrode 12 disposed between the first n⁺-doped material layer 8 and the second n⁺-doped material layer 9. The top gate 121 is disposed on the arrayed nanochannel structure 71, and the side gates 122 are disposed in the recesses 72 formed by the arrayed nanochannel structure 71, as shown in FIG. 6L. Step S9 includes following steps S91-S93.

S91, the gate electrode pattern is formed through photolithography on the sample obtained in step S8.

Specifically, a double-layer photoresist is coated on the sample obtained in step S8, with a thickness of lift-off resist at a bottom layer about 0.35 μm and a thickness of photoresist at a top layer about 0.56 μm; then, the exposure is performed on the gate electrode pattern region through photomask by a photolithography machine followed by post-baking; after the post-baking and a sample temperature has dropped to the room temperature, the development is performed to remove the photoresist on the gate electrode pattern region, thereby completing the photolithography and forming the gate electrode pattern.

S92, a (nickel) Ni/Au metal electrode is deposited via the electron-beam evaporation device.

Specifically, the residual photoresist is removed from the exposed regions by using the plasma resist remover, and then the electron-beam evaporation device is used to sequentially evaporate a Ni layer with a thickness of 45 nm and an Au layer with a thickness of 200 nm.

S93, the metal in the unexposed regions is stripped to form the gate electrode 12.

Specifically, the sample obtained after the metal evaporation is soaked in acetone for over 3 hours followed by ultrasonicating until the metal in the unexposed regions completely peels off to obtain a second metal-removed sample. The second metal-removed sample is placed in a stripping solution at 60° C. for water-bath heating for 15 minutes, and then placed in acetone and isopropanol sequentially in that order for ultrasonic cleaning for 3 minutes, followed by rinsing with ultrapure water for 2 minutes and then drying with nitrogen gas to form the gate electrode 12. The top gate 121 is disposed on the arrayed nanochannel structure 71, and the side gates 122 are disposed in the recesses 72 defined by the arrayed nanochannel structure 71.

S10, metal interconnection is performed to interconnect the source electrode 10, drain electrode 11, and gate electrode 12, including following steps S101-S103.

S101, interconnection patterns are formed through photolithography.

Specifically, the sample obtained in step S9 is coated with photoresist, the exposure is performed on the metal electrode region through the photomask by using the photolithography machine followed by post-baking, and after the post-baking is completed and a sample temperature has dropped to the room temperature, the development is performed to remove the photoresist on the exposed region, completing the photolithography.

S102, Ti/Au metal electrodes are deposited via the electron-beam evaporation device.

Specifically, the residual photoresist is removed from the exposed region by using the plasma resist remover and then the electron-beam evaporation device is used to sequentially evaporate a Ti layer with a thickness of 45 nm and an Au layer with a thickness of 200 nm.

S103, the metal in the unexposed region is stripped to form the metal interconnection structure.

Specifically, the sample obtained after the metal evaporation is soaked in acetone for over 3 hours followed by ultrasonicating until the metal in the unexposed region completely peels off, with retained metal forming the metal interconnection structure. The sample with the metal interconnection structure is placed in a stripping solution at 60° C. for water-bath heating for 15 minutes, and then placed in acetone and isopropanol for ultrasonic cleaning for 3 minutes, followed by rinsing with ultrapure water for 2 minutes and then drying with nitrogen gas to complete the manufacturing of the nanochannel GaN-based device.

In the manufacturing method of the nanochannel GaN-based device of the embodiments, the mask layer 70 is grown before the growth of the n⁺ material layers. Then, the patterns of the ohmic regrowth region and the nanochannels 73 are defined simultaneously, allowing the nanochannel structure and the patterned ohmic contact structure to be formed in one step, which reduces the requirements for photolithography alignment precision, effectively avoids process errors, and simplifies the process.

In the manufacturing method of the embodiments, before removing the mask layer 70 from the device surface, a high etch selectivity SiO₂ mask layer is used as an etch stop layer for dry etching. The n⁺ material layers on the arrayed nanochannel structure 71 and within the recesses 72 between the nanochannels 73 are removed by using the Cl-based etching, achieving self-alignment of the nanochannels 73, and reducing the difficulty of photolithography and etching processes.

The above content is a further detailed explanation of the disclosure based on specific illustrated embodiments, and cannot be assumed that the specific implementations of the disclosure are limited to these explanations. For those skilled in the art to which the disclosure belongs, several simple deductions or substitutions can be made without departing from the concept of the disclosure, which should be considered as within the scope of protection of the disclosure.

What is claimed is:

1. A nanochannel gallium nitride (GaN)-based device, comprising:

a substrate layer (1), a nucleation layer (2), a buffer layer (3), a channel region (4), an insertion layer (5), a barrier layer (6), a cap layer (7), a first n⁺-doped material layer (8), a second n⁺-doped material layer (9), a source electrode (10), a drain electrode (11), and a gate electrode (12);

wherein the substrate layer (1), the nucleation layer (2), the buffer layer (3), the channel region (4), the insertion layer (5), the barrier layer (6) and the cap layer (7) are sequentially stacked in that order;

wherein the first n⁺-doped material layer (8) is disposed in a source electrode region, and penetrates through the cap layer (7), the barrier layer (6), and the insertion layer (5), a bottom of the first n⁺-doped material layer (8) is disposed under channels of the channel region (4), the first n⁺-doped material layer (8) comprises a first arrayed pattern edge (81) facing towards the drain electrode (11), and the source electrode (10) is disposed on the first n⁺-doped material layer (8);

wherein the second n⁺-doped material layer (9) is disposed in a drain electrode region and penetrates through the cap layer (7), the barrier layer (6), and the insertion layer (5), a bottom of the second n⁺-doped material layer (9) is disposed under the channels of the channel region (4), the second n⁺-doped material layer (9) comprises a second arrayed pattern edge (91) facing towards the source electrode (10), and the drain electrode (11) is disposed on the second n⁺-doped material layer (9);

wherein a part of the channel region (4), the insertion layer (5), the barrier layer (6) and the cap layer (7)

together form an arrayed nanochannel structure (71) between the source electrode region and the drain electrode region, the first arrayed pattern edge (81) is interdigitated with an end of the arrayed nanochannel structure (71), and the second arrayed pattern edge (91) is interdigitated with another end of the arrayed nanochannel structure (71); and wherein the gate electrode (12) is disposed between the first n⁺-doped material layer (8) and the second n⁺-doped material layer (9), on the arrayed nanochannel structure (71) and in recesses (72) defined by the arrayed nanochannel structure (71), to form a three-dimensional gate-all-around structure.

2. The nanochannel GaN-based device as claimed in claim 1, wherein a material of the substrate layer (1) comprises one or more selected from the group consisting of sapphire, silicon carbide and silicon; and wherein a material of the barrier layer (6) comprises one or more selected from the group consisting of aluminum nitride (AlN), indium aluminum nitride (InAlN), scandium aluminum nitride (ScAlN), and aluminum gallium nitride (AlGaN).

3. The nanochannel GaN-based device as claimed in claim 1, wherein a material of each of the first n⁺-doped material layer (8) and the second n⁺-doped material layer (9) comprises at least one of n⁺-GaN and n⁺-InGaN.

4. The nanochannel GaN-based device as claimed in claim 1, wherein the first arrayed pattern edge (81) comprises a plurality of first rectangular structures (811), and the plurality of first rectangular structures (811) are disposed evenly along an edge of the first n⁺-doped material layer (8); and wherein the second arrayed pattern edge (91) comprises a plurality of second rectangular structures (911), and the plurality of second rectangular structures (911) are disposed evenly along an edge of the second n⁺-doped material layer (9).

5. The nanochannel GaN-based device as claimed in claim 4, wherein a length of each of the plurality of first rectangular structures (811) is in a range of 20-1500 nanometers (nm), a width of each of the plurality of first rectangular structures (811) is in a range of 20-2000 nm, and a spacing between adjacent two of the plurality of first rectangular structures (811) is in a range of 20-2000 nm; and wherein a length of each of the plurality of second rectangular structures (911) is in a range of 20-1500 nm, a width of each of the plurality of second rectangular structures (911) is in a range of 20-2000 nm, and a spacing between adjacent two of the plurality of second rectangular structures (911) is in a range of 20-2000 nm.

6. The nanochannel GaN-based device as claimed in claim 1, wherein the arrayed nanochannel structure (71) comprises at least one nanochannel (73), and the at least one nanochannel (73) is disposed evenly along a gate width direction of the gate electrode (12).

7. The nanochannel GaN-based device as claimed in claim 6, wherein a width of each of the at least one nanochannel (73) is in a range of 20-2000 nm, and a spacing between adjacent two of the at least one nanochannel (73) is in a range of 20-2000 nm.

* * * * *